United States Patent [19]
Lee

[11] Patent Number: 5,663,092
[45] Date of Patent: Sep. 2, 1997

[54] METHODS OF FABRICATING A TRANSISTOR CELL WITH A HIGH ASPECT RATIO BURIED CONTACT

[75] Inventor: Kyu-pil Lee, Kyungki-do, Rep. of Korea

[73] Assignee: Samsung Electronics Co., Ltd., Suwon, Rep. of Korea

[21] Appl. No.: 664,976

[22] Filed: Jun. 14, 1996

[30] Foreign Application Priority Data

Sep. 19, 1995 [KR] Rep. of Korea .................. 95-30686

[51] Int. Cl.⁶ .................................................. H01L 21/8242
[52] U.S. Cl. .................... 438/253; 438/301; 438/586; 438/624; 438/702
[58] Field of Search ........................... 437/26, 47, 60, 437/915, 919, 984

[56] References Cited

U.S. PATENT DOCUMENTS

| | | | |
|---|---|---|---|
| 5,296,400 | 3/1994 | Park et al. | 437/60 |
| 5,335,138 | 8/1994 | Sandhu et al. | 437/60 |
| 5,464,787 | 11/1995 | Ryou | 437/60 |
| 5,492,851 | 2/1996 | Ryou | 437/915 |

*Primary Examiner*—Chandra Chaudhari
*Attorney, Agent, or Firm*—Bell, Seltzer, Park & Gibson

[57] ABSTRACT

A cell transistor for a dynamic random access memory cell (DRAM) is formed on a substrate, including a capped gate line formed on the substrate, spaced apart source/drain regions formed in the substrate disposed on opposite sides of the capped gate line, a capped channel line overlying and separated from the gate line by an intervening dielectric region and contacting a first of the source/drain regions through the intervening dielectric region, and a second dielectric region covering the capped channel line. To form a buried contact, the transistor is etched with an etchant which etches the intervening dielectric region and the second dielectric region at a first rate and gate line and channel line caps covering the gate and channel lines at a second rate, the first rate being greater than the second rate, for an etching time sufficient to expose a second of the source/drain regions while leaving the gate line and the channel line covered. The first etching rate preferably is at least 20 times greater than the second etching rate. Preferably, the gate line cap and the channel line cap each include silicon nitride, the first interlayer dielectric region includes silicon dioxide and one of borophosphosilicate glass or ozone-tetraethylorthosilicate ($O_3$-TEOS), the second dielectric region includes ozone-tetraethylorthosilicate ($O_3$-TEOS), the third interlayer dielectric region includes silicon dioxide, and the etchant includes $C_3F_8$ gas or $C_4F_8$ gas, applied at approximately 3 milliTorr to approximately 4 milliTorr.

20 Claims, 6 Drawing Sheets

METHODS OF FABRICATING A TRANSISTOR CELL WITH A HIGH ASPECT RATIO BURIED CONTACT

FIELD OF THE INVENTION

The present invention relates to methods of fabricating integrated circuit devices, in particular, to methods of fabricating transistor cells for dynamic random access memory (DRAM) devices and other integrated circuit devices.

BACKGROUND OF THE INVENTION

As memory circuits have become increasingly integrated, the design rule for their fabrication has decreased from approximately 1 µm for conventional 1-Mbit DRAMs to approximately 0.15 µm for 1-Gbit DRAMs. As the design rule has decreased, there has generally been a corresponding decrease in the size of contact holes used to access the transistor regions in the substrate upon which the word and bit lines of the memory device are formed.

In stacked capacitor DRAMs, three-dimensional capacitor structures typically are formed in such contact holes. The aspect ratio of the contact holes is typically high, as the contact hole typically passes through word and bit line layers, as well as intervening insulation regions. With increased integration of the transistor cells in the device, the aspect ratio generally increases. The increased aspect ratio may make it difficult to fabricate the contact holes for the transistor cells using conventional photolithographic techniques without misaligning the holes with respect to the transistor structures. Thus, alignment tolerance is an important factor in the producibility of submicron design rule transistor cells.

FIG. 1 is a sectional view of a conventional DRAM cell, including a bit line 16 with a capping insulating layer 17, a semiconductor substrate 10, a field region 12, a source region 13, an interlayer dielectric 18, a spacer 21, and a storage electrode 23. As illustrated, when conventional photo-lithographic techniques are employed to pattern a contact hole for the storage electrode 23, the contact hole pattern may be misaligned, causing a portion 17A of the bit line 16 to be exposed. When the storage electrode 23 is formed, the exposed bit line portion 17A may electrically contact the storage electrode 23, causing failure of the memory device.

Similar misalignment problems may occur with respect to word lines. FIG. 2 is a cross-sectional view of a the conventional DRAM cell of FIG. 1, along the bit line, illustrating a polycide word line 26 with a capping insulating layer 27, and a spacer 21. Here, because the contact hole pattern typically is more closely aligned with respect to the upper layers of the device than with respect to the lower layers of the device, a word line 26 and a source region 13 removed from the top surface of the substrate may be significantly misaligned with respect to the contact hole pattern. Upon etching, misalignment of the pattern may cause a portion 26A of the bit line 26 to be exposed, allowing an undesirable electrical contact between the bit line 26 and the storage electrode 23 subsequently formed in the contact hole. In addition, the misalignment may reduce the contact area accessible on the source region 13. Although forming spacers on the side of the contact hole may help improve alignment tolerance, if misalignment is sufficient, the storage electrode 23 may still contact active portions of the word and bit lines.

SUMMARY OF THE INVENTION

In light of the foregoing, it is an object of the present invention to provide methods for manufacturing transistors with high aspect ratio buried contacts having greater alignment tolerance than buried contacts formed using conventional photolithographic techniques.

This and other objects, features and advantages are provided according to the present invention by methods for fabricating transistors having buried contacts in which a cell transistor including a capped gate line formed on a substrate, a capped channel line separated from the capped gate line by an intervening dielectric region, and a second dielectric region formed overlying the capped channel line is formed and patterned using an etchant that etches the dielectric regions at a faster rate than it etches the caps covering the gate and channel lines to thereby expose underlying drain/source regions in the substrate while leaving the gate and channel lines covered. The caps preferably include silicon nitride, the intervening dielectric region preferably includes silicon dioxide and one of borophosphosilicate glass and ozone-tetraethylorthosilicate ($O_3$-TEOS), and the second dielectric region preferably includes silicon dioxide. Preferably, the etchant etches the dielectric regions at a rate at least 20 times greater than the caps. The etchant preferably includes one of $C_3F_8$ gas and $C_4F_8$ gas, preferably at a pressure of approximately 3 to 4 milliTorr.

By taking advantage of the different etching characteristics of the gate and channel line caps with respect to the dielectric regions, the present invention can prevent exposure of the gate line and/or channel line, e.g., word and bit lines due to misalignment of the buried contact hole pattern with respect to the underlying structures. The gate and channel line caps serve as masks for etching away the dielectric regions to expose the underlying source/drain region, thus helping to prevent etch-through into the gate and channel lines due to contact hole pattern misalignment.

In particular, according to the present invention, a transistor having a self-aligned buried contact site is fabricated by forming a cell transistor on a substrate, the cell transistor including a capped gate line formed on the substrate, spaced apart source/drain regions formed in the substrate disposed on opposite sides of the capped gate line, a capped channel line overlying and separated from the gate line by an intervening dielectric region and contacting a first of the source/drain regions through the intervening dielectric region, and a second dielectric region covering the capped channel line, the capped gate line including a gate line and a gate line cap covering top surface and side wall portions of the gate line, the capped channel line including a channel line and a channel line cap covering top surface and side wall portions of the channel line. The cell transistor is then etched with an etchant which etches the intervening dielectric region and the second dielectric region at a first rate and the gate line and channel line caps at a second rate, the first rate being greater than the second rate, for an etching time sufficient to expose a second of the source/drain regions while leaving the gate line and the channel line covered. A dynamic random access memory (DRAM) cell may then be formed by forming a storage electrode contacting exposed portions of the second source/drain region.

The first etching rate preferably is at least 20 times greater than the second etching rate. More preferably, the gate line cap and the channel line cap each include silicon nitride, the first interlayer dielectric region includes silicon dioxide and one of borophosphosilicate glass or ozone-tetraethylorthosilicate ($O_3$-TEOS), the second dielectric region includes ozone-tetraethylorthosilicate ($O_3$-TEOS), the third interlayer dielectric region includes silicon dioxide, and the etchant includes $C_3F_8$ gas or $C_4F_8$ gas, applied at approximately 3 milliTorr to approximately 4 milliTorr.

The cell transistor may be formed by first forming a capped gate line on the substrate, the capped gate line including a gate line and a gate line cap covering top surface and side wall portions of the gate line. Spaced apart source/drain regions are formed in the substrate, disposed on opposite sides of the gate line. A first interlayer dielectric region is formed on the substrate, covering the capped gate line. A channel line contact is formed on the first interlayer dielectric region, contacting a first of the source/drain regions through the first interlayer dielectric region. A second interlayer dielectric region is formed on the first interlayer dielectric region. A capped channel line is formed on the second interlayer dielectric region, the capped channel line including a channel line overlying and contacting the channel line contact and a channel line cap covering top surface and side wall portions of the channel line. A third interlayer dielectric region is then formed on the substrate, covering the capped channel line. The gate line cap and the channel line cap preferably each include silicon nitride, the first interlayer dielectric region preferably includes silicon dioxide and borophosphosilicate glass or ozone-tetraethylorthosilicate ($O_3$-TEOS), the second dielectric region preferably includes ozone-tetraethylorthosilicate ($O_3$-TEOS), and the third interlayer dielectric region includes silicon dioxide. Thus a cell transistor is provided having gate line and channel line caps which have different etching characteristics than the dielectric regions.

The capped gate line may be formed by forming a first insulation layer on the substrate, forming a first conductive layer on the first insulation layer, forming a second conductive layer on the first conductive layer, forming a second insulation layer on the second conductive layer, and patterning the first insulation layer, the first conductive layer, the second conductive layer and the second insulation layer to form a gate line and a top surface insulating region adjacent a top surface portion of the gate line. To form spaced apart source/drain regions, ions are implanted into portions of the substrate adjacent the gate line using the gate line and the top wall insulating region as a mask to thereby form spaced apart source/drain regions. A third insulation layer may then be formed on the substrate and anisotropically etched to leave side wall insulating regions adjacent side wall portions of the gate line. Thereby a gate line cap covering top surface and side wall portions of the gate line is formed. Preferably, the first insulation layer includes deposited silicon dioxide, the first conductive layer includes doped polysilicon, the second conductive layer includes metal silicide, the second insulation layer includes silicon nitride, and the third insulation layer includes silicon nitride.

The first interlayer dielectric region may be formed by forming a first insulation layer on the substrate, forming a second insulation layer on the first insulation layer sufficient to cover the gate line cap, and planarizing the substrate to thereby form a first interlayer dielectric region overlying the gate line cap. The second insulation layer preferably is borophosphosilicate glass or ozone-tetraethylorthosilicate. The step of planarizing preferably includes reflowing the second insulation layer and etching back or chemical mechanical polishing the substrate.

A channel line contact is formed by removing portions of the first interlayer dielectric region overlying the drain region to expose portions of the drain region and forming a conductive layer on the first interlayer dielectric region, contacting exposed portions of the drain region through the first interlayer dielectric region. The conductive layer is then patterned to form a channel line contact. Preferably, the conductive layer, and thus the channel line contact, is doped polysilicon.

The second interlayer dielectric region may be formed by forming an insulation layer on the substrate, covering the channel line contact, and planarizing the substrate to form a second interlayer dielectric region. The second insulation layer preferably is ozone-tetraethylorthosilicate, and preferably is planarized by etching back or chemical mechanical polishing the substrate.

A capped channel line is formed by patterning the second interlayer dielectric region to expose portions of the channel line contact. A conductive layer is formed on the second interlayer dielectric region, contacting exposed portions of the channel line contact. A first insulation layer is then formed on the conductive layer, and the first insulation layer and the conductive layer patterned to form a channel line and a top surface insulating region adjacent a top surface of the channel line. A second insulation layer is then formed on the substrate and anisotropically etched to leave side wall insulating regions adjacent side wall portions of the channel line to thereby form a channel line cap covering top and side wall portions of the channel line, the channel line cap including the top surface and side wall insulating regions. Preferably, the conductive layer is high-conductivity tungsten or metal silicide and the first and second insulation layers each are silicon nitride. A barrier layer may be formed on the substrate before formation of the first insulation layer, the barrier layer preferably including titanium nitride (TiN). Then the first insulation layer may be formed on the barrier layer and patterning performed as above to produce a channel line including a first channel line region formed from the conductive layer and a second channel line region formed from the barrier layer.

BRIEF DESCRIPTION OF THE DRAWINGS

Some of the objects and advantages of the present invention having been stated, others will be more fully understood from the detailed description that follows and by reference to the accompanying drawings in which.

DETAILED DESCRIPTION

Figure 1:
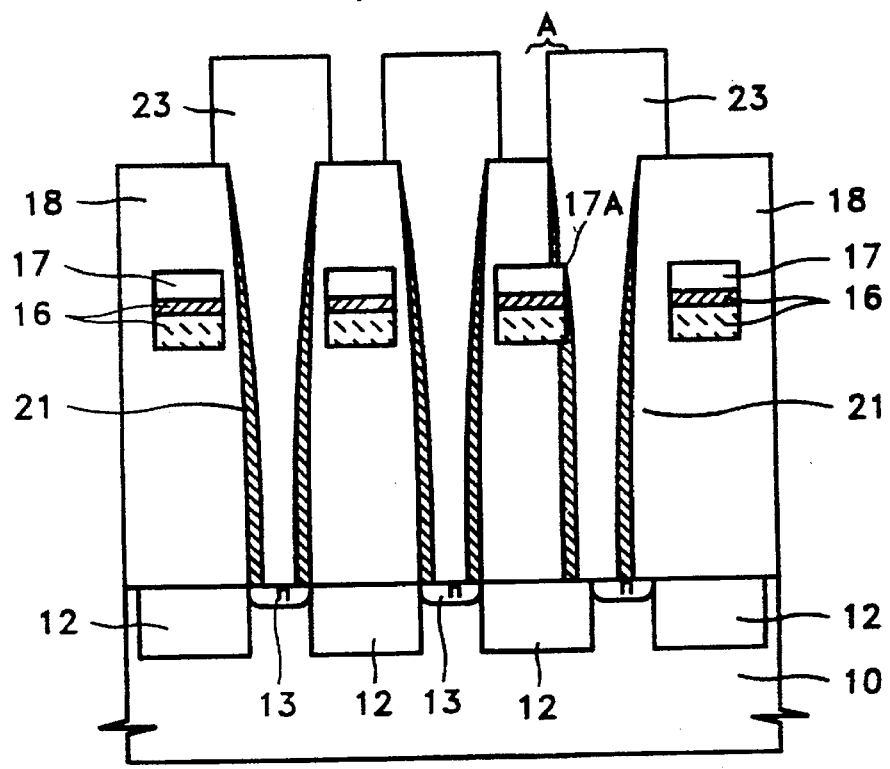
FIGS. 1 and 2 are cross-sectional views of a dynamic random access memory cell according to the prior art.
Figure 2:
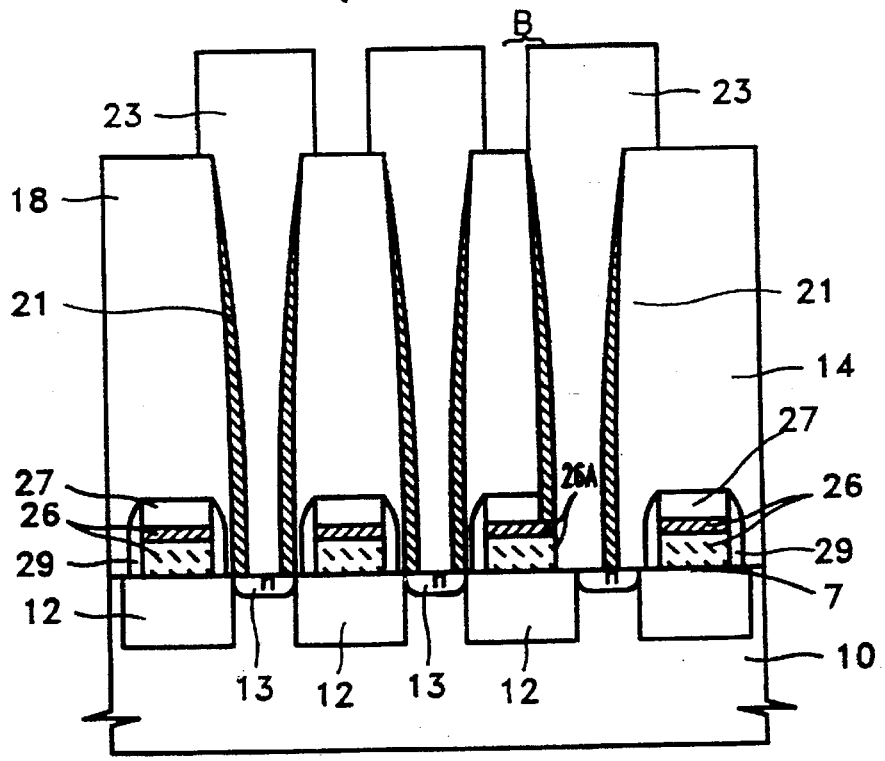

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout.

Figure 6:
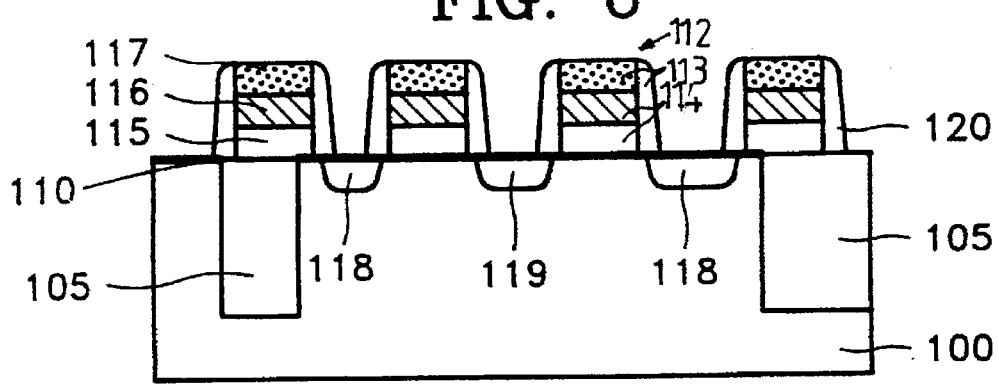
FIGS. 6–13 are cross-sectional views of a DRAM cell during intermediate fabrication steps according to the present invention.

FIG. 6 illustrates steps for forming a capped gate line 112 including a gate line 114 formed from first and second gate line portions 155, 116, capped by gate line cap 113 including a top-surface insulating region 117 and side wall insulating regions 120. Spaced apart source/drain regions 118, 119 are formed disposed on opposite sides of the capped gate line 112. First, a field region 105 is formed on a substrate 100 by a device isolation process such as shallow trench isolation (STI) or local oxidation of silicon (LOCOS), thereby defining an active region for forming a transistor. A first insulation layer, preferably a silicon dioxide film, is formed on the substrate 100. A first conductive layer, a second conductive layer, and a second insulating layer are sequentially deposited on the first insulation layer. The first insulation layer, first conductive layer, second conductive layer, and second insulating layer are then patterned to form the gate line 114 and the top surface insulating region 117. The gate line 114 preferably has a polycide structure wherein the first conductive layer from which the first gate line region 115 is formed is a doped polysilicon layer and the second conductive layer from which the second gate line region 116 is formed is a metal silicide layer. The top surface insulating region 117, formed from the second insulating layer, preferably includes silicon nitride. The spaced apart source/drain regions 118, 119 preferably are formed by ion-implantation using the gate line 114 and the top surface insulating region 117 as a mask. To form the side wall insulating region 120, a third insulation layer is formed, preferably silicon nitride deposited on the substrate to a thickness of approximately 500 Å. The third insulation layer is anisotropically etched to leave the sidewall insulating regions 120 adjacent the sidewall portions of the gate line 115 and the top surface insulating region 117. Together, the sidewall insulating regions 120 and the top surface insulating region 117 form a gate line cap 113.

Figure 7:
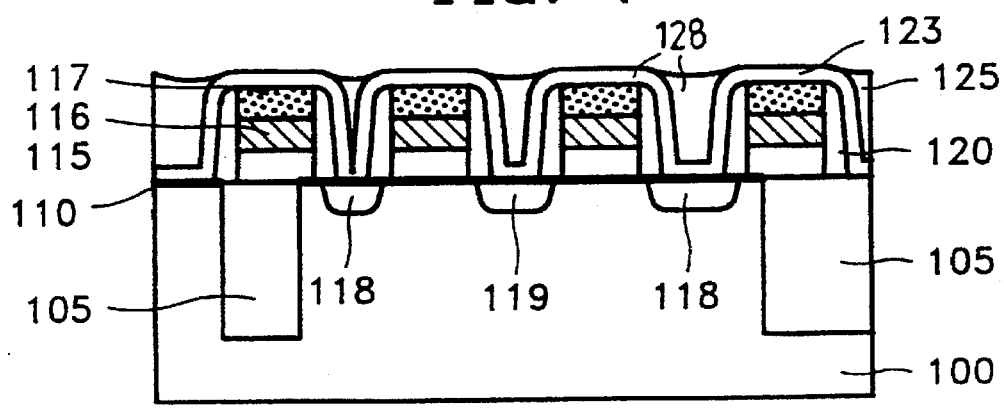
Figure 8:
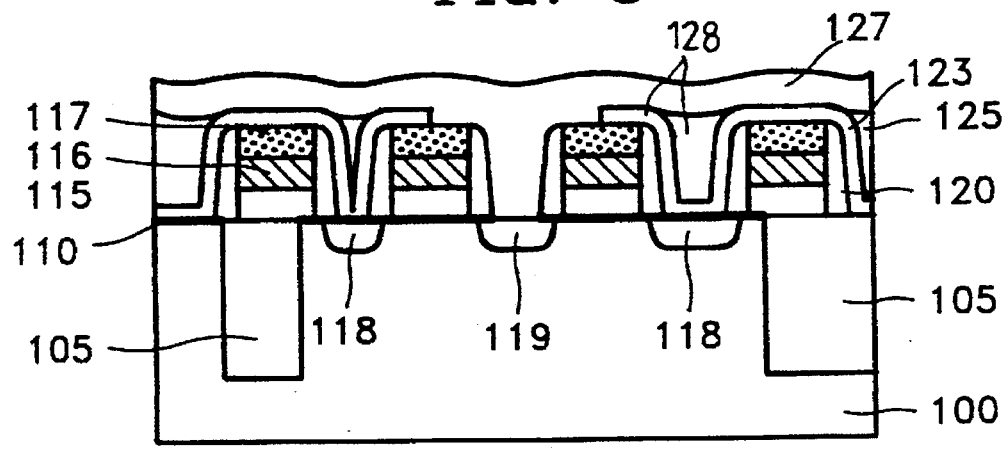

FIG. 7 illustrates steps for producing a first interlayer dielectric region 128 on the gate line cap 113. A first insulating layer is formed on the substrate, and a second insulating layer is formed on first insulating layer sufficient to cover the gate line cap 113, preferably to a thickness of 5,000 Å or less. The second insulation layer preferably includes borophosphosilicate glass (BPSG) having a high fluidity or ozone-tetraethylorthosilicate ($O_3$-TEOS). The first interlayer dielectric region 128 is formed by planarizing the substrate, preferably using a reflow technique, or using an etch-back process or chemical mechanical polishing (CMP) process combined with the reflow process.

Figure 9:
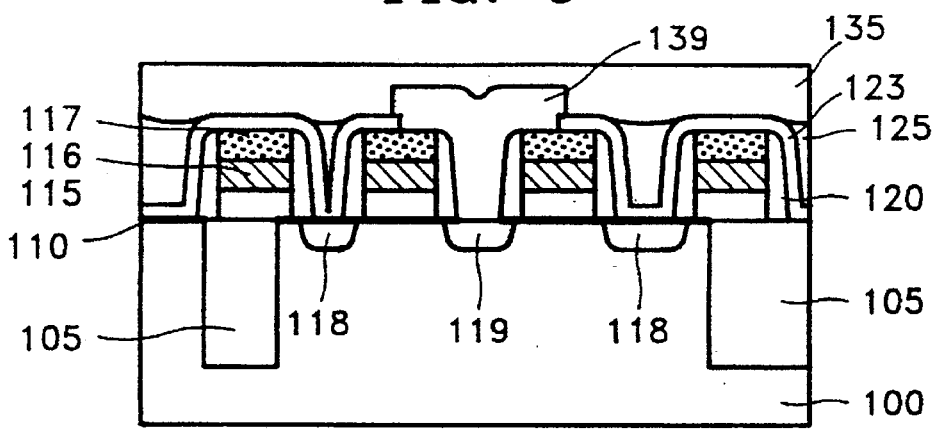

FIGS. 8–11 illustrate steps for forming a channel line contact 139 for contacting a first of the source/drain regions 119, and for forming a second interlayer dielectric region 137. Preferably, a photoresist pattern is used as a mask for removing portions of the first interlayer dielectric region 128 overlying the first source/drain region 119. Thereafter, a conductive layer 127, preferably including doped polysilicon, is formed on the substrate, contacting the first source drain region 119. Referring to FIG. 9, the channel line contact 139 is formed by patterning the conductive layer 127. An insulation layer 135 is then formed on the substrate, preferably of a thickness sufficient to cover the channel line contact 139. The insulation layer 135, preferably including $O_3$-TEOS, is then planarized using an etch-back or CMP process.

Figure 10:
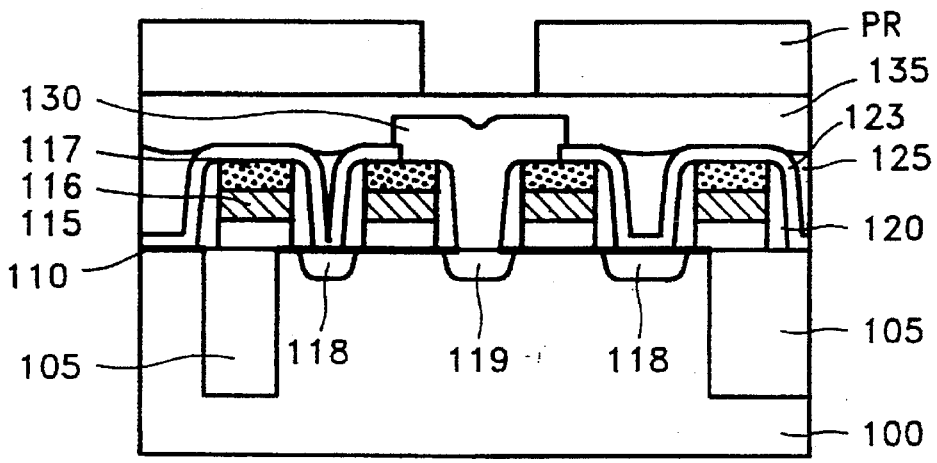
Figure 11:
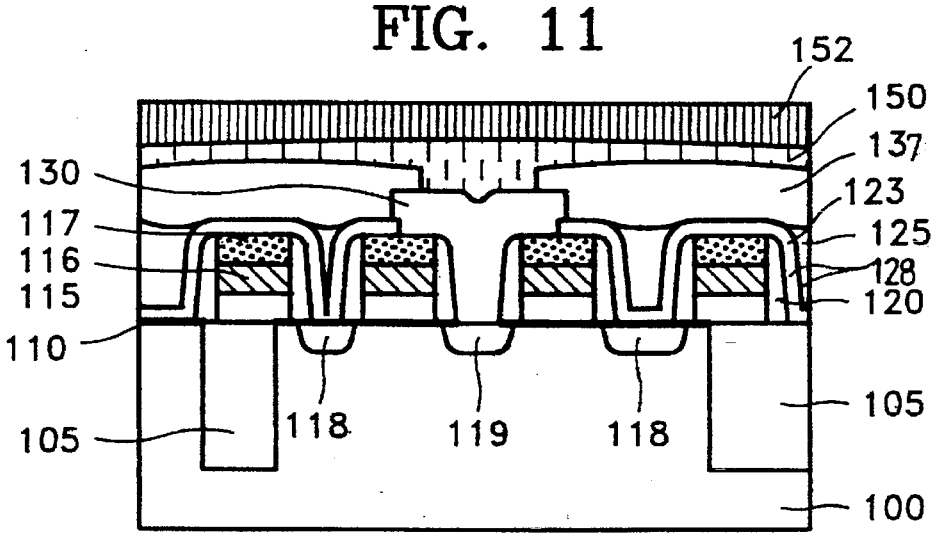

In FIGS. 10 and 11, the insulation layer 135 is patterned, preferably using a photomask PR, to form second interlayer dielectric region 137 having a contact hole therethrough for making contact with the channel line contact 139. A conductive layer 150, preferably high-conductivity tungsten or metal silicide, is formed on the second interlayer dielectric region 137, contacting the channel line contact 139 through the contact hole. An insulation layer 152, preferably silicon nitride having a thickness of several hundred Angstroms, is then formed on the conductive layer 150. To form a two-layer channel line, a barrier layer, preferably titanium nitride (TiN) may be formed on the conductive layer 150 before the insulation layer 152 is formed.

Figure 12:
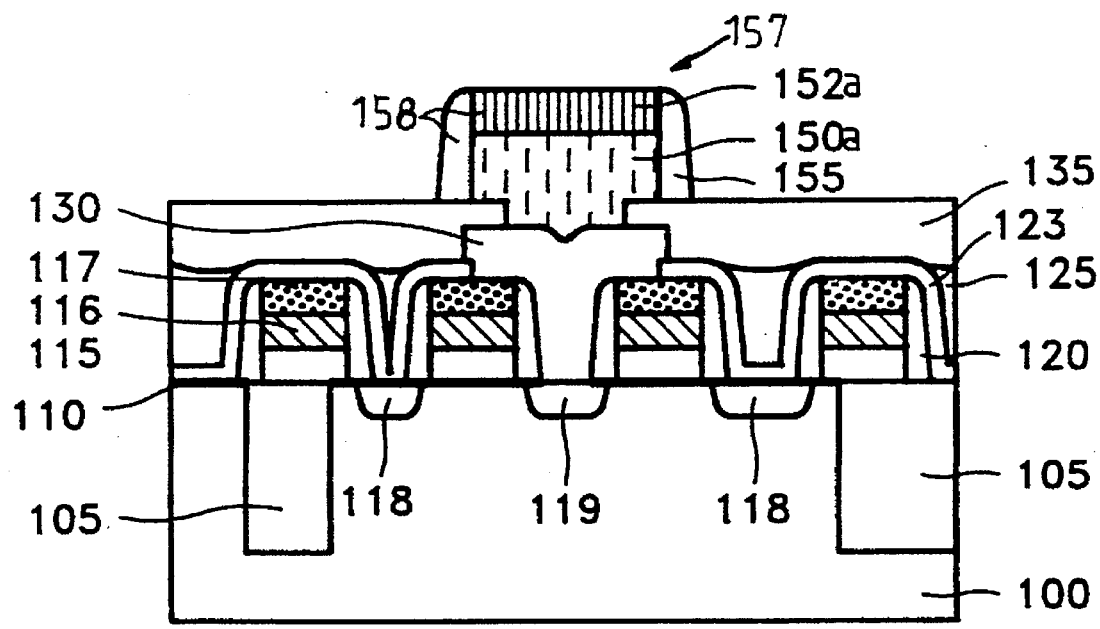
Figure 13:
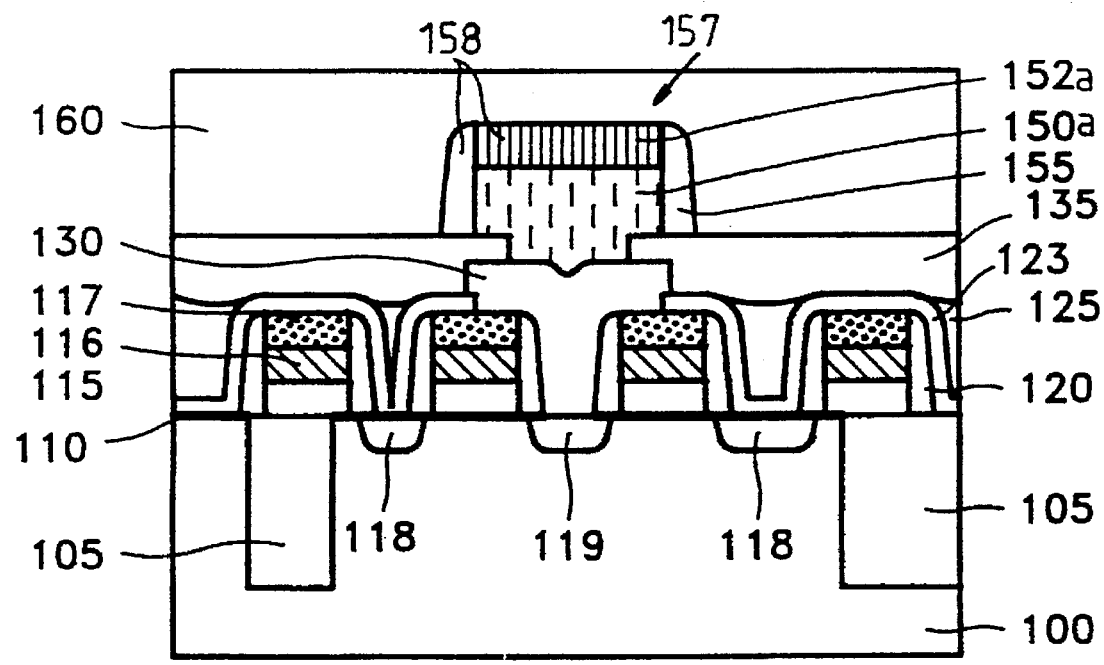

FIGS. 12 and 13 illustrate steps for forming a capped channel line 157, including a channel line 150a and a channel line cap 158 including a top surface insulating region 152a adjacent a top surface portion of the channel line 150a and side wall insulating regions 155 adjacent side wall portions of the channel line 150a and the top surface insulating region 152a. The insulating layer 152 and the conductive layer 150 of FIG. 11 are patterned, preferably using a photoresist film formed on the insulating layer 152, to form the channel line 150a and the top surface insulating region 152a. As described above, the channel line may include a second channel line region formed from a barrier layer. To complete the cap 158, a second insulating layer is formed on the substrate, preferably including silicon nitride, and anisotropically etched to leave the side wall insulating regions 155.

FIG. 13 also illustrates steps for forming a third interlayer dielectric region 160 overlying the capped channel line 157. An insulation layer, preferably including silicon dioxide, is formed on the substrate, covering the capped channel line 157. The substrate is then planarized, thereby forming the third interlayer dielectric region 160.

Figure 3:
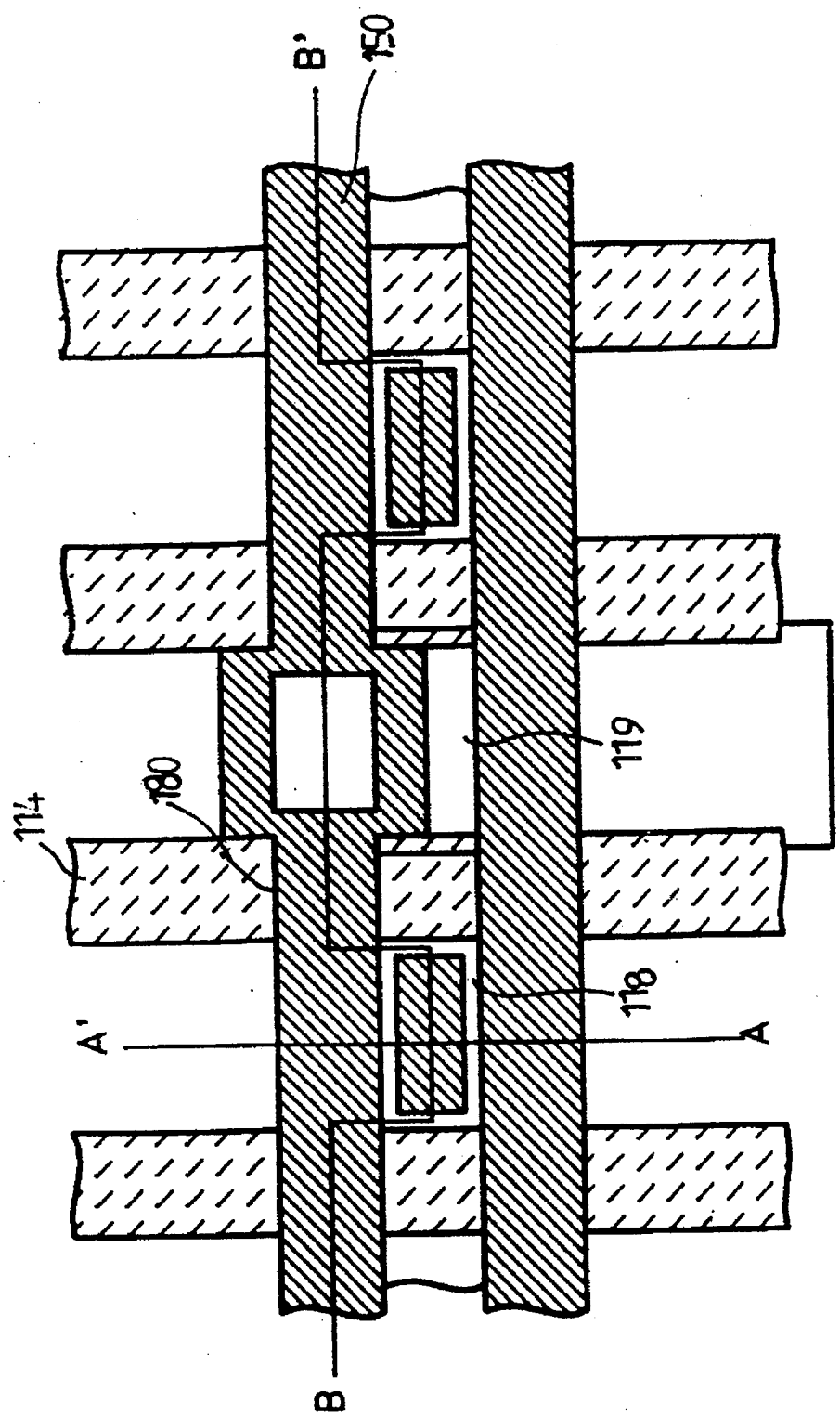
FIG. 3 is a plan view of a DRAM cell according to the present invention.
Figure 4:
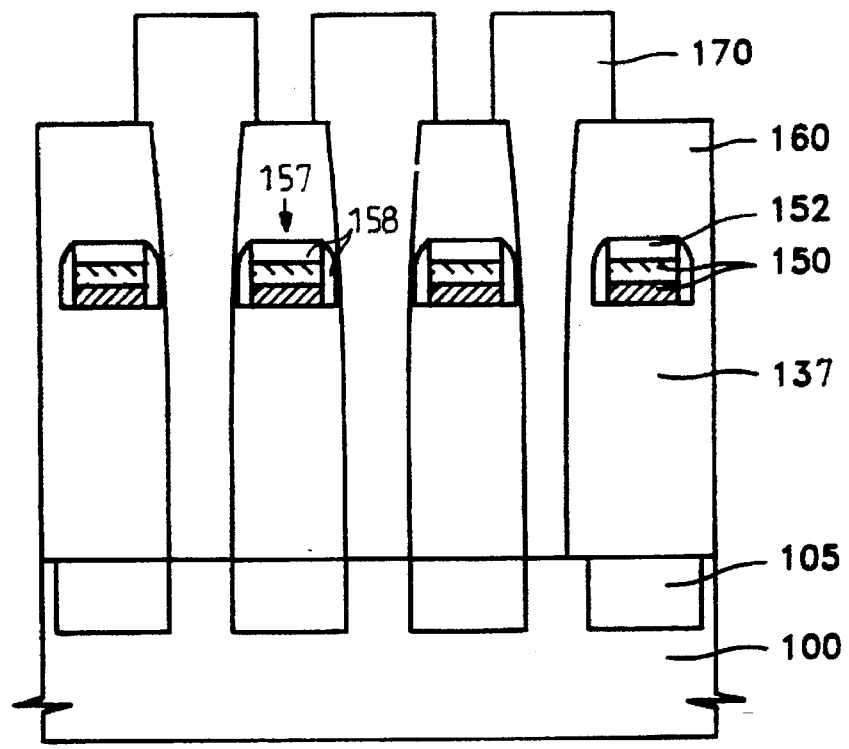
FIGS. 4 and 5 are cross sectional views of a DRAM cell according to the present invention.
Figure 5:
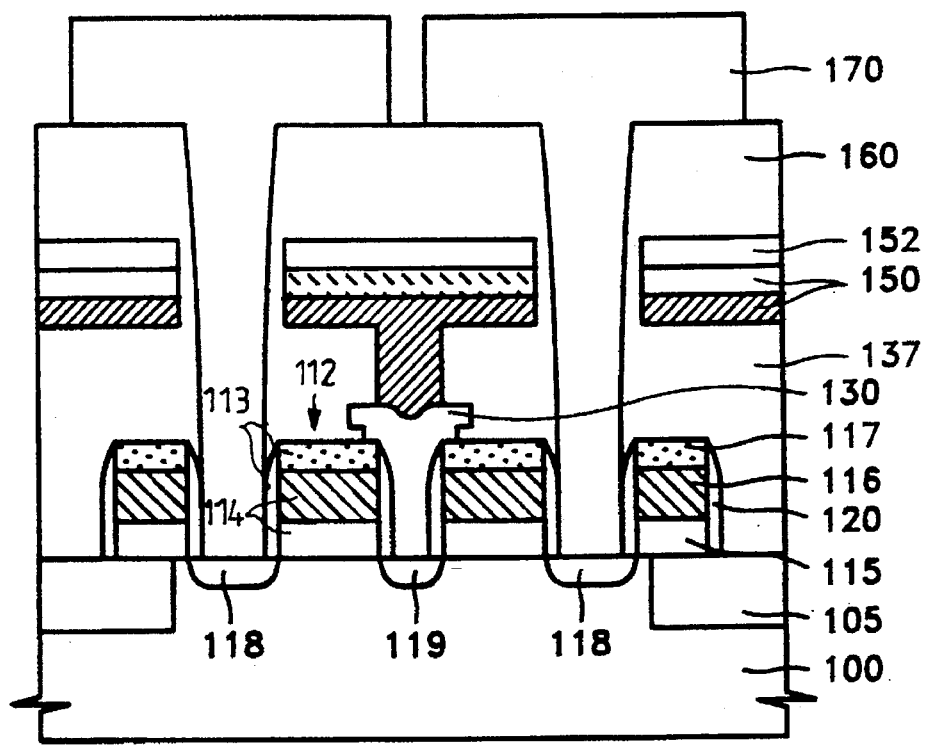

FIGS. 3–5 illustrate steps for forming a buried contact site for a storage electrode 170 in a transistor cell 180. FIG. 3 is a plan view illustrating a transistor cell 180 including a gate line 114, channel line 150, and first and second source/drain regions 118, 119. Referring to FIGS. 4 and 5, which provide a cross-sectional views along the lines A–A' and B–B' of FIG. 3, respectively, the transistor cell 180, including capped gate line 112, capped channel line 157, and the first, second and third interlayer dielectric regions 128, 137, 160 is patterned using an etchant which etches the first, second and third interlayer dielectric regions 128, 137, 160 at a first etching rate and the gate line and channel line caps 113, 158 at a second etching rate greater than the first etching rate, such that the second source/drain region 118 is exposed while leaving the gate line 114 and the channel line 150 covered.

Preferably, the first etching rate is at least 20 times greater than the second etching rate. To achieve the preferred rate, the gate line and channel line caps 113, 158 preferably include silicon nitride, the first interlayer dielectric region preferably includes silicon dioxide and one of borophosphosilicate glass and ozone-tetraethylorthosilicate ($O_3$-TEOS), the second dielectric region includes ozone-tetraethylorthosilicate ($O_3$-TEOS), and the third interlayer dielectric region includes silicon dioxide, with etching being performed using a $C_3F_8$ or $C_4F_8$ etching gas at a pressure of 3–4 milliTorr. A dielectric film, plate electrode, and wiring may then be fabricated on the transistor cell 180 according to well-known techniques to form a stacked capacitor DRAM cell.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A method of fabricating a transistor having a self-aligned buried contact site, the method comprising the steps of:

forming a cell transistor on a substrate, the cell transistor including a capped gate line formed on the substrate, spaced apart source/drain regions formed in the substrate disposed on opposite sides of the capped gate line, a capped channel line overlying and separated from the gate line by an intervening dielectric region and contacting a first of the source/drain regions through the intervening dielectric region, and a second dielectric region covering the capped channel line, the capped gate line including a gate line and a gate line cap covering top surface and side wall portions of the gate line, the capped channel line including a channel line and a channel line cap covering top surface and side wall portions of the channel line; and etching the cell transistor with an etchant which etches the intervening dielectric region and the second dielectric region at a first rate and the gate line and channel line caps at a second rate, the first rate being greater than the second rate, for an etching time sufficient to expose a second of the source/drain regions while leaving the gate line and the channel line covered.

2. A method according to claim 1 wherein said step of forming a cell transistor comprises the steps of:

forming a capped gate line including a gate line and a gate line cap covering top surface and side wall portions of the gate line;

forming spaced apart source/drain regions in the substrate disposed on opposite sides of the gate line;

forming a first interlayer dielectric region on the substrate, covering the capped gate line;

forming a channel line contact on the first interlayer dielectric region, contacting a first of the source/drain regions through the first interlayer dielectric region;

forming a second interlayer dielectric region on the first interlayer dielectric region;

forming a capped channel line on the second interlayer dielectric region including a channel line overlying and contacting the channel line contact and a channel line cap covering top surface and side wall portions of the channel line; and forming a third interlayer dielectric region on the substrate, covering the capped channel line.

3. A method according to claim 2 wherein the gate line cap and the channel line cap each comprise silicon nitride, wherein the first interlayer dielectric region comprises silicon dioxide and one of borophosphosilicate glass and ozone-tetraethylorthosilicate (O$_3$-TEOS), wherein the second dielectric region comprises ozone-tetraethylorthosilicate (O$_3$-TEOS), and wherein the third interlayer dielectric region comprises silicon dioxide.

4. A method according to claim 2 wherein said step of forming a capped gate line comprises the steps of:

forming a first insulation layer on the substrate;

forming a first conductive layer on the first insulation layer;

forming a second conductive layer on the first conductive layer;

forming a second insulation layer on the second conductive layer;

patterning the first insulation layer, the first conductive layer, the second conductive layer and the second insulation layer to form a gate line and a top surface insulating region adjacent a top surface portion of the gate line;

forming a third insulation layer on the substrate; and anisotropically etching the third insulation layer to leave side wall insulating regions adjacent side wall portions of the gate line, thereby forming a gate line cap covering top surface and side wall portions of the gate line.

5. A method according to claim 4 wherein the first insulation layer comprises deposited silicon dioxide, wherein the first conductive layer comprises doped polysilicon, wherein the second conductive layer comprises metal silicide, wherein the second insulation layer comprises silicon nitride, and wherein the third insulation layer comprises silicon nitride.

6. A method according to claim 2 wherein said step of forming spaced apart source/drain regions is preceded by the steps of:

sequentially forming a first insulation layer, a first conductive layer, a second conductive layer, and a second insulation layer on the substrate; and patterning the first insulation layer, the first conductive layer, the second conductive layer and the second insulation layer to form a gate line and a top surface insulating region adjacent a top portion of the gate line; and wherein said step of forming spaced apart source/drain regions comprises the step of implanting ions into portions of the substrate adjacent the gate line using the gate line and the top wall insulating region as a mask to thereby form spaced apart source/drain regions.

7. A method according to claim 2 wherein said step of forming a first interlayer dielectric region comprises the steps of:

forming a first insulation layer on the substrate;

forming a second insulation layer on the first insulation layer sufficient to cover the gate line cap; and planarizing the substrate to thereby form a first interlayer dielectric region overlying the gate line cap.

8. A method according to claim 7 wherein the second insulation layer comprises one of borophosphosilicate glass and ozone-tetraethylorthosilicate, and wherein said step of planarizing comprises the step of reflowing the second insulation layer.

9. A method according to claim 8 wherein said step of planarizing comprises one of etching back and chemical mechanical polishing the substrate.

10. A method according to claim 2 wherein said step of forming a channel line contact comprises the steps of:

removing portions of the first interlayer dielectric region overlying the drain region to expose portions of the drain region;

forming a conductive layer on the first interlayer dielectric region, contacting exposed portions of the drain region through the first interlayer dielectric region; and patterning the conductive layer to form a channel line contact.

11. A method according to claim 10 wherein the conductive layer and the channel line contact each comprise doped polysilicon.

12. A method according to claim 2 wherein said step of forming a capped channel line comprises the steps of:

patterning the second interlayer dielectric region to expose portions of the channel line contact;

forming a conductive layer on the second interlayer dielectric region, contacting exposed portions of the channel line contact;

forming a first insulation layer on the conductive layer;

patterning the first insulation layer and the conductive layer to form a channel line and a top surface insulating region adjacent a top surface of the channel line;

forming a second insulation layer on the substrate; and anisotropically etching the second insulation layer to leave side wall insulating regions adjacent side wall portions of the channel line to thereby form a channel line cap covering top and side wall portions of the channel line, the channel line cap including the top surface and side wall insulating regions.

13. A method according to claim 12 wherein the conductive layer comprises one of high-conductivity tungsten and metal silicide, and wherein the first and second insulation layers each comprise silicon nitride.

14. A method according to claim 12:

wherein said step of forming a first insulation layer is preceded by the step of forming a barrier layer on the conductive layer, the barrier layer comprising titanium nitride (TiN);

wherein said step of forming a first insulation layer comprises the step of forming a first insulation layer on the barrier layer; and wherein said step of patterning comprises the step of patterning the first insulation layer, the barrier layer and the conductive layer to form a channel line and a top surface insulating region adjacent a top surface of the channel line, the channel line including a first channel line region formed from the conductive layer and a second channel line region formed from the barrier layer.

15. A method according to claim 1 wherein the first etching rate is at least 20 times greater than the second etching rate.

16. A method according to claim 2 wherein the first etching rate is at least 20 times greater than the second etching rate.

17. A method according to claim 2 wherein the gate line cap and the channel line cap each comprise silicon nitride, wherein the first interlayer dielectric region comprises silicon dioxide and one of borophosphosilicate glass and ozone-tetraethylorthosilicate ($O_3$-TEOS), wherein the second dielectric region comprises ozone-tetraethylorthosilicate ($O_3$-TEOS), wherein the third interlayer dielectric region comprises silicon dioxide, and wherein the etchant comprises one of a $C_3F_8$ gas and a $C_4F_8$ gas.

18. A method according to claim 17 wherein said step of etching comprises the step of etching at approximately 3 to approximately 4 milliTorr.

19. A method of fabricating a dynamic random access memory (DRAM) cell, the method comprising the steps of:

forming a cell transistor on a substrate, the cell transistor including a capped gate line formed on the substrate, spaced apart source/drain regions formed in the substrate disposed on opposite sides of the capped gate line, a capped channel line overlying and separated from the gate line by an intervening dielectric region and contacting a first of the source/drain regions through the intervening dielectric region, and a second dielectric region covering the capped channel line, the capped gate line including a gate line and a gate line cap covering top surface and side wall portions of the gate line, the capped channel line including a channel line and a channel line cap covering top surface and side wall portions of the channel line;

etching the cell transistor with an etchant which etches the intervening dielectric region and the second dielectric region at a first rate and the gate line and channel line caps at a second rate, the first rate being greater than the second rate, for an etching time sufficient to expose a second of the source/drain regions while leaving the gate line and the channel line covered; and forming a storage electrode contacting exposed portions of the second source/drain region.

20. A method according to claim 19 wherein said step of forming a cell transistor comprises the steps of:

forming a capped gate line including a gate line and a gate line cap covering top surface and side wall portions of the gate line;

forming spaced apart source/drain regions in the substrate disposed on opposite sides of the gate line;

forming a first interlayer dielectric region on the substrate, covering the capped gate line;

forming a channel line contact on the first interlayer dielectric region, contacting a first of the source/drain regions through the first interlayer dielectric region;

forming a second interlayer dielectric region on the first interlayer dielectric region;

forming a capped channel line on the second interlayer dielectric region including a channel line overlying and contacting the channel line contact and a channel line cap covering top surface and side wall portions of the channel line; and forming a third interlayer dielectric region on the substrate, covering the capped channel line.

* * * * *